(12) United States Patent
Yoon et al.

(10) Patent No.: US 8,576,039 B2
(45) Date of Patent: Nov. 5, 2013

(54) INDUCTOR STRUCTURE

(75) Inventors: Jangsup Yoon, Thousand Oaks, CA (US); Charles Dozier, Scottsdale, AZ (US); Vlad Lenive, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/312,683

(22) Filed: Dec. 6, 2011

(65) Prior Publication Data

US 2013/0141203 A1   Jun. 6, 2013

(30) Foreign Application Priority Data

Dec. 6, 2011 (GB) .................................. 1120936.8

(51) Int. Cl.
*H01F 27/29* (2006.01)

(52) U.S. Cl.
USPC ........................................................ 336/192

(58) Field of Classification Search
USPC ........................ 336/192, 200, 232, 206–208
See application file for complete search history.

(56) References Cited

U.S. PATENT DOCUMENTS

| | | | | |
|---|---|---|---|---|
| 5,572,179 | A * | 11/1996 | Ito et al. ........................ | 336/200 |
| 6,236,297 | B1 | 5/2001 | Chou et al. | |
| 6,512,422 | B2 * | 1/2003 | Dufour et al. ................. | 331/167 |
| 7,151,430 | B2 * | 12/2006 | Mattsson ....................... | 336/200 |
| 7,432,794 | B2 * | 10/2008 | Mattsson ....................... | 336/225 |
| 7,535,330 | B2 * | 5/2009 | Erickson et al. ............... | 336/200 |
| 7,642,891 | B2 * | 1/2010 | Einzinger et al. ............. | 336/226 |
| 8,018,312 | B2 * | 9/2011 | Kossel et al. .................. | 336/200 |
| 8,044,756 | B2 * | 10/2011 | Fahs ............................... | 336/200 |
| 8,344,841 | B2 * | 1/2013 | Gertenbach et al. .......... | 336/173 |
| 2006/0220778 | A1 | 10/2006 | Marques | |

FOREIGN PATENT DOCUMENTS

| | | |
|---|---|---|
| WO | 98/05048 A1 | 2/1998 |
| WO | 2008/066141 A1 | 6/2008 |
| WO | 2009/101565 A1 | 8/2009 |

\* cited by examiner

*Primary Examiner* — Tuyen Nguyen
(74) *Attorney, Agent, or Firm* — Novak Druce Connolly Bove+Quigg LLP; Vincent M DeLuca

(57) ABSTRACT

An inductor structure includes an even number of segments, each segment adjacent to two segments, each segment including a loop, each loop having a first end and a second end; and a crossover section adjacent to each segment, the crossover section coupling each of the first ends and second ends of the loops so as to cause current to circulate around the loop of each segment in an opposite rotational direction to the direction of current circulation in the loops of the segments adjacent to that segment.

20 Claims, 8 Drawing Sheets

INDUCTOR STRUCTURE

BACKGROUND OF THE INVENTION

It has become increasingly common in the silicon integrated circuit (IC) industry to design so-called System-on-Chip (SoC) solutions. The driving force behind this trend is the ever present desire to minimize the chip area required to perform the required functionality of the chip, and hence ultimately reduce the size and weight of the electronic devices into which the chip is incorporated.

Reducing the size of the components on the chip is not the only problem encountered in realising a more compact design. Another problem is that the components must be positioned closer to each other on the chip. This is particularly problematic for inductors. Inductors radiate magnetic fields that interfere with the operation of the circuitry surrounding them. The strength of the magnetic field is inversely proportional to the square of the radial distance from the inductor, thus the further away that the surrounding circuitry is located, the less interference it suffers as a result of the magnetic field. FIG. 1 illustrates a traditional spiral inductor 100 in which current enters the inductor at feed line 104, flows in an anticlockwise direction around each turn of the inductor as illustrated by arrow 102, and exits the inductor at feed line 106. This current generates a magnetic field in a direction perpendicular to the plane of the inductor. The strength of the magnetic field and its direction in the proximity of the inductor is illustrated in the plot of FIG. 2. The plot shows that the magnetic field strength has no dependence on the radial direction in the plane of the inductor. The magnetic field strength is dependent on the elevation and distance from the center of the inductor.

The magnetic field is particularly problematic for two inductors located on the same chip. Here, each inductor couples with the other inductor (called cross coupling). This is as a result of the current flowing through each inductor inducing a magnetic field which radiates to the other inductor and induces a current in that inductor. This cross coupling changes the operation of the inductor. For example, if an inductor is used as a voltage controlled oscillator (VCO) then the cross coupling changes the current through the inductor and hence changes the resonant frequency of the VCO. This coupling also constitutes an additional channel to pick up the noise.

It is not possible to prevent a magnetic field from being created by an on-chip inductor. However, efforts have been made to configure inductors so as to reduce the resultant magnetic field components experienced at distance from them. One configuration of an inductor that has been designed to address this problem is the so-called figure-of-8 inductor. Such an inductor 300 is shown schematically in FIG. 3. Current enters the inductor via a feed line 302 which joins the inductor at the centre of the inductor from a plane perpendicular to the plane of the inductor. The current flows around the structure in the directions indicated by the arrows. The current exits the inductor via a feed line 304 which exits the inductor in a plane perpendicular to the plane of the inductor. As a result of the crossover section in the middle of the figure-of-8 inductor, the current flows in a clockwise direction around the lower loop 306 of the inductor and in an anticlockwise direction around the upper loop 308 of the inductor.

As indicated using conventional notation on FIG. 3, the magnetic field created by the current flowing clockwise around the lower loop is directed into the page and the magnetic field created by the current flowing anticlockwise around the upper loop is directed out of the page. The field lines join such that most of the magnetic field components in the plane of the inductor are contained within the area of the figure-of-8 structure. A degree of cancellation of the magnetic field components is thus achieved at distance from the inductor in the plane of the inductor. Additionally, the magnetic field is cancelled in the plane of the inductor at distance along an axis that bisects the inductor structure such that the lower loop is on one side of the axis and the upper loop is on the other side of the axis.

This axis is marked 310 on FIG. 3. The cancellation is achieved because the upper loop and lower loop are the same size and shape and are perfectly symmetrical about the axis 310. The magnetic field components along the axis 310 radiated from the two loops are equal in magnitude but opposite in direction, and hence cancel leaving no resultant magnetic field.

The magnetic field in the proximity of the figure-of-8 inductor shown in FIG. 3 is considerably reduced compared to the magnetic field radiating from the spiral inductor shown in FIG. 1, and cancellation is achieved at distance along the axis 310. Thus, other components positioned along the axis 310 outside the boundary of the figure-of-8 inductor experience considerably less interference than they would if positioned in a corresponding place outside the boundary of the spiral inductor. However, interference/cross coupling is still a problem when using the figure-of-8 inductor because residual magnetic field components remain at distance from the figure-of-8 structure everywhere except along the axis 310 defined above.

Thus, there is a need for an improved inductor design which reduces the resultant magnetic field at distance from the inductor.

SUMMARY OF THE INVENTION

According to a first aspect of the invention, there is provided an inductor structure comprising: an even number of segments, each segment adjacent to two segments, each segment including a loop, each loop having a first end and a second end; and a crossover section adjacent to each segment, the crossover section coupling each of the first ends and second ends of the loops so as to cause current to circulate around the loop of each segment in an opposite rotational direction to the direction of current circulation in the loops of the segments adjacent to that segment.

Suitably, the areas circumscribed by each loop are the same.

Suitably, each loop has the same size and shape to the other loops in the inductor structure.

Suitably, the segments are radially located about an azimuthal axis.

Suitably, the crossover section is located at the centre of the inductor structure, and the structure has rotational symmetry about an azimuthal axis located at the centre of the inductor structure, each loop being located in a plane perpendicular to the azimuthal axis.

Suitably, the inductor structure is symmetrical about at least four axes.

Suitably, a first feed line and a second feed line are both connected to a loop of a segment at the periphery of the inductor structure.

Suitably, the inductor structure forms an unbroken metal line from the first feed line to the second feed line.

Suitably, the crossover section couples the first ends and second ends of the loops such that, for each segment, the first end of the loop of the segment is connected to the first end of the loop of one of the adjacent segments.

Suitably, the crossover section couples the first ends and second ends of the loops such that, for each segment, the second end of the loop of the segment is connected to the second end of the loop of the other one of the adjacent segments.

Suitably, each loop comprises a first turn and a second turn.

Suitably, the second turn circumscribes the first turn.

Suitably, the inductor structure includes four segments only. Alternatively, the inductor structure includes eight segments only.

Suitably, the inductor structure has an octagonal profile.

Suitably, all the segments are located on the same plane.

Suitably, one of the segments is located on a first plane, and another of the segments is located on a second plane, the second plane being different to the first plane and parallel to the first plane.

Suitably, the inductor structure is formed by metallisation on a substrate.

Suitably, the crossover section is formed on different metal layers.

According to a second aspect of the invention, there is provided an integrated circuit including the inductor structure.

BRIEF DESCRIPTION OF THE DRAWINGS

The present invention will now be described by way of example with reference to the accompanying drawings. In the drawings.

DETAILED DESCRIPTION OF THE INVENTION

The following disclosure describes a set of inductor structures which, by virtue of their shapes, result in increased cancellation of their radiated magnetic fields at distance compared to the described prior art inductor structures. The described inductor structures have $2^N$ loops, where N is an integer and N≥2. The loops have identical size and shape. The loops meet in the centre of the inductor structure. The inductor structure has rotational symmetry of order $2^N$. The inductor structure is symmetrical about $2^N$ axes in the plane of the inductor. Cancellation of the magnetic field components outside of the inductor structure occurs along each of the $(2^N)/2$ axes which bisect the inductor such that $(2^N)/2$ loops are wholly on one side of the axis and $(2^N)/2$ loops are wholly on the other side of the axis. Thus, the interference/cross coupling effects experienced by circuitry positioned outside of the inductor structure are reduced compared to circuitry positioned outside of prior art inductor structures.

It will be understood in the description that follows that the inductor structure is designed such that substantially complete cancellation of magnetic field components at distance is achieved along at least one axis. The characteristics described in the description are not intended to necessarily confer absolute cancellation of magnetic field components as a result of the inductor structure design. Consequently, references in the description to specific relative locations of parts of the inductor structure are to be interpreted to mean that those parts are to be located close enough to the specified location that substantial cancellation of magnetic field components at distance is achieved. Similarly, references to equalities of areas, sizes, shapes, lengths, magnetic fluxes or similar are to be interpreted to mean that the degree of similarity between the compared quantities is such that substantial cancellation of magnetic field components at distance is achieved. Similarly, references to the inductor structure or parts of the inductor structure being symmetrical about an axis are to be interpreted to include such structures or parts of structures that, although not exactly symmetrical about the axis, are close enough to exhibiting the mentioned symmetry that substantial cancellation of the magnetic field components at distance is achieved.

The inductor structures described herein operate using alternating current (a.c.). The following description describes the operation of the inductor structures when the current flows in a first direction. It will be understood that when the current alternates such that it flows in the opposite rotational direction, the converse operation to that described below applies.

Figure 1:
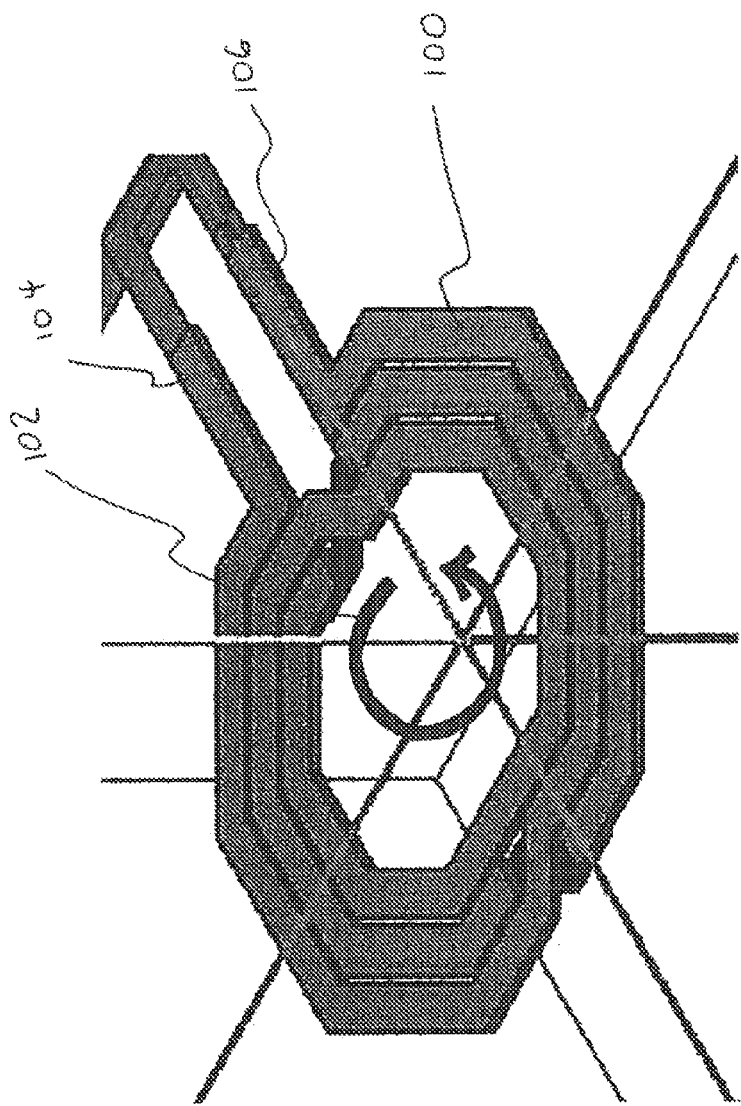
FIG. 1 is a schematic diagram of a prior art spiral inductor.
Figure 2:
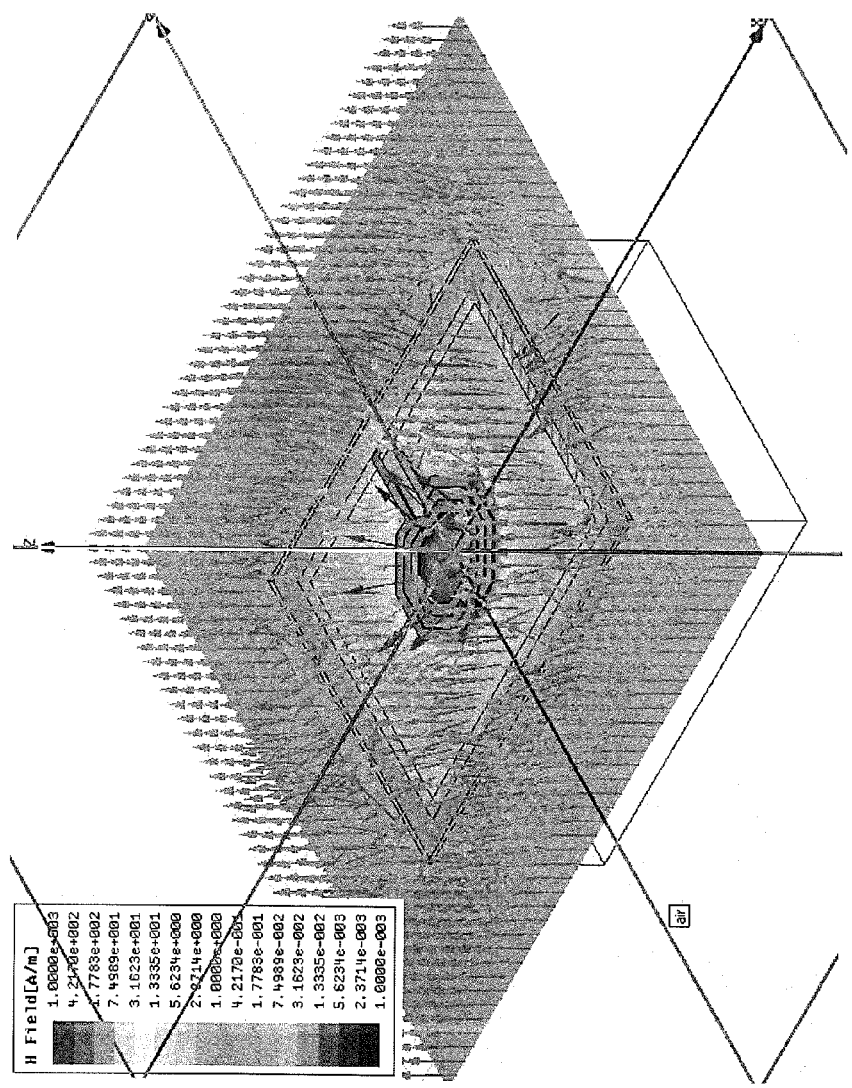
FIG. 2 is a plot illustrating the magnetic field radiated from the spiral inductor of FIG. 1.
Figure 3:
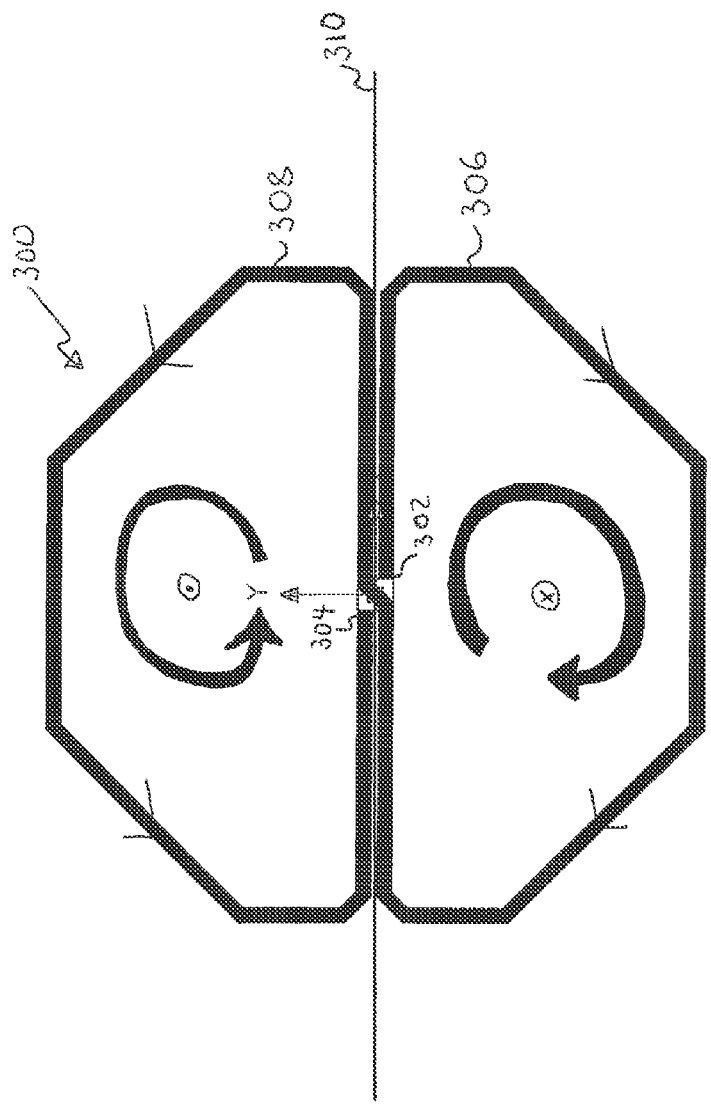
FIG. 3 is a schematic diagram of a prior art figure-of-8 inductor.
Figure 4:
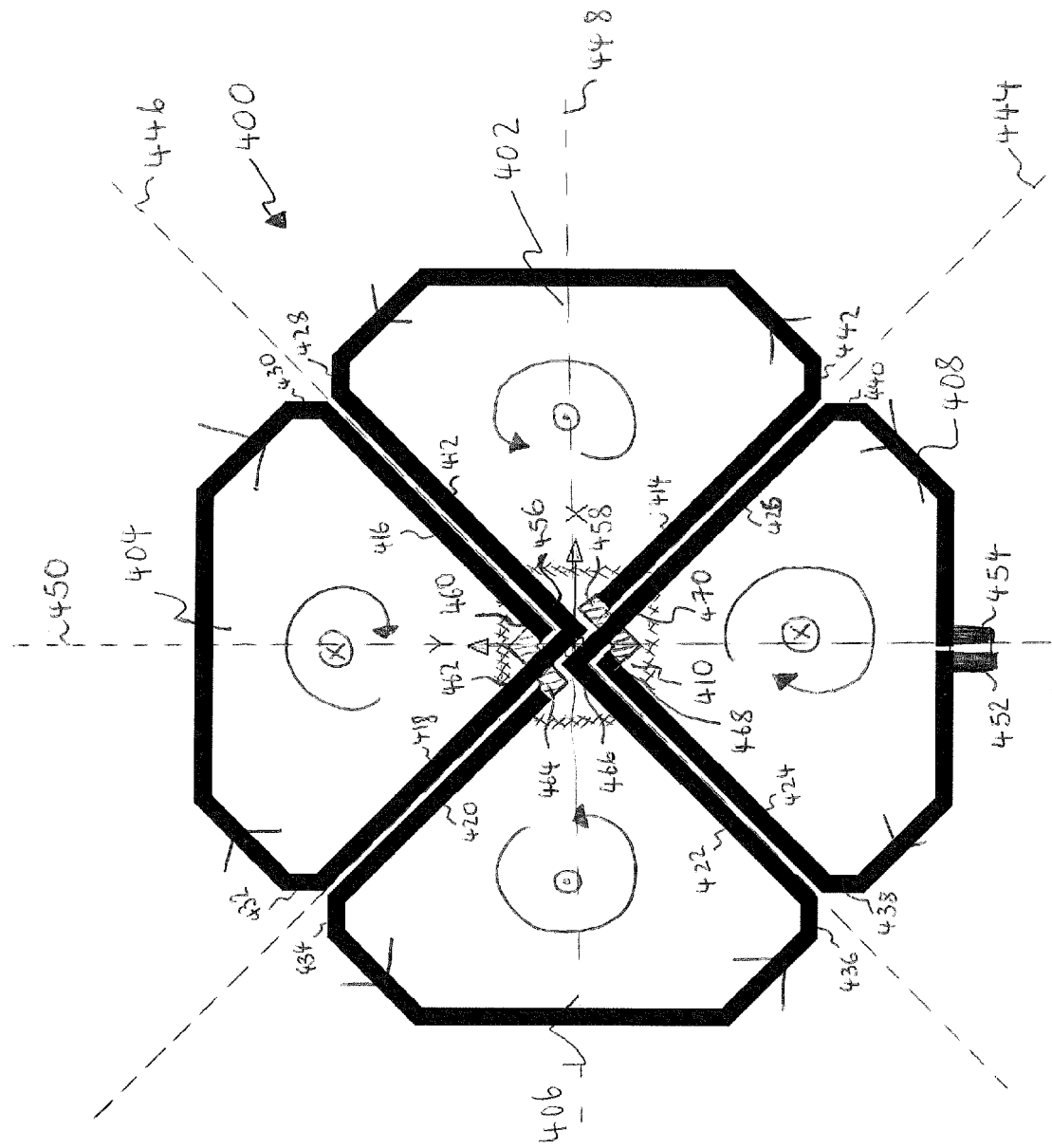
FIG. 4 is a schematic diagram of a 4-loop inductor.

FIG. 4 illustrates a schematic diagram of an exemplary 4-loop inductor structure 400. The inductor structure 400 has a first loop 402, a second loop 404, a third loop 406, and a fourth loop 408. Each loop is open and has a first end and a second end. The ends of all four loops are coupled together in the central region of the inductor structure referred to herein as the crossover section 410. The crossover section 410 joins each loop end to one other loop end such that when current is applied to the inductor, the current circulates around each loop in an opposite rotational direction to the rotational direction of the current circulation in the loops adjacent to that loop. For example, the first loop is adjacent to the second loop and the fourth loop. The current flows around the first loop in an anti-clockwise direction illustrated by the arrows. However, the current flows around the second loop and the fourth loops in a clockwise direction, illustrated by the arrows. The same principle applies for each of the four loops. Preferably, each loop end is joined to only one other loop end in this crossover section.

Preferably, the inductor structure is considered to comprise four equal segments which are identical in size and shape. The segments extend radially from the crossover section. Each segment butts up to the crossover section. Each segment is adjacent to a segment on either side of it. The radial boundaries of adjacent segments butt up to each other. Each segment includes one of the four loops of the inductor structure. Each segment includes only one loop of the inductor structure.

In FIG. 4, the size and shape of the loops are the same. The area encompassed by each loop is identical. Each loop may be mapped directly onto another one of the loops by rotating it about the centre of the inductor structure. In the arrangement of FIG. 4, each loop has two sides which extend radially from the crossover section at the centre of the inductor structure. These radial sides 412, 414, 416, 418, 420, 422, 424, 426 extend along the peripheral radial edges of the segment in which the loop is located. The radial segments are internal to the inductor structure. Each radial side is parallel to a radial side of a loop in an adjacent segment. Each radial side of a loop is parallel to the closest radial side of the closest loop. For example, radial side 412 of the first loop 402 is parallel to radial side 416 of the second loop. For each loop, the radial sides are connected by a portion of the loop which forms the outer peripheral edge of the inductor structure. The inductor structure in FIG. 4 has an octagonal profile. Thus, for each loop the radial sides are connected by a portion of the loop which has the shape of a quarter of an octagon. The inductor structure does not have a perfectly octagonal profile. There are small notches in the octagonal profile caused by the portions of the loops marked as 428, 430, 432, 434, 436, 438, 440 and 442. These notches reduce the overall area utilised by the inductor, and also reduce the RF loss and improve the Q-factor.

The inductor structure of FIG. 4 exhibits four degrees of symmetry. The inductor structure is symmetrical about the axes marked 444 and 446. Each of these axes bisects the inductor structure such that two of the four loops are wholly on one side of the axis and the other two of the four loops are wholly on the other side of the axis. The two axes 444 and 446 taken together delineate the inductor structure into four segments which correspond to the segments described above. The two axes 444 and 446 taken together delineate the inductor structure into the four loops. The inductor structure is also symmetrical about the axes marked 448 and 450. The inductor structure has rotational symmetry of order four, since the structure looks the same when it is rotated by 90°.

In FIG. 4, the feed lines which supply current to the inductor structure are fed into the inductor structure at the exterior of the structure via one of the loops. Feed line 452 is connected to the fourth loop, and supplies current to the inductor structure. Feed line 454 is also connected to the fourth loop, and current leaves the inductor structure via this feed line. The other loops which are not connected to feed lines have no breaks in them between their two ends.

In an alternative example, the feed lines are connected to the inductor structure at the crossover section. In this case, all the loops have no breaks in them between their ends. If the feed lines extend from the crossover section out of the plane of the inductor, then the implementation is more symmetrical and results in a better cancellation of the magnetic field from the inductor structure. However, this is technically more difficult to implement than feeding the inductor structure at its periphery.

In the example of FIG. 4, the crossover section directly connects each loop end with a loop end of an adjacent loop. Loop end 456 of the first loop 402 is directly connected to loop end 462 of the second loop 404. Loop end 460 of the second loop 404 is directly connected to loop end 464 of the third loop 406. Loop end 466 of the third loop 406 is directly connected to loop end 470 of the fourth loop 408. Loop end 468 of the fourth loop 408 is directly connected to loop end 458 of the first loop 402. In the example of FIG. 4, the inductor structure is formed on a planar layer, with the exception of the connection between the second loop 404 and the third loop 406 and the connection between the third loop 406 and the fourth loop 408 which underpass the planar layer on a lower metal layer.

The crossover section 410 shown on FIG. 4 is encompassed by a hashed box. The crossover section 410 is centred on the centre point of the inductor structure. The crossover section 410 lies wholly within the central region of the inductor structure. Suitably, the central region is defined by a circle centred at the centre of the inductor structure with a radius less than xr. In this definition r is the average length of a straight line connecting the centre point of the inductor structure to an exterior edge of the inductor structure. Preferably x lies in the range ⅓ to ⅑.

Figure 5:
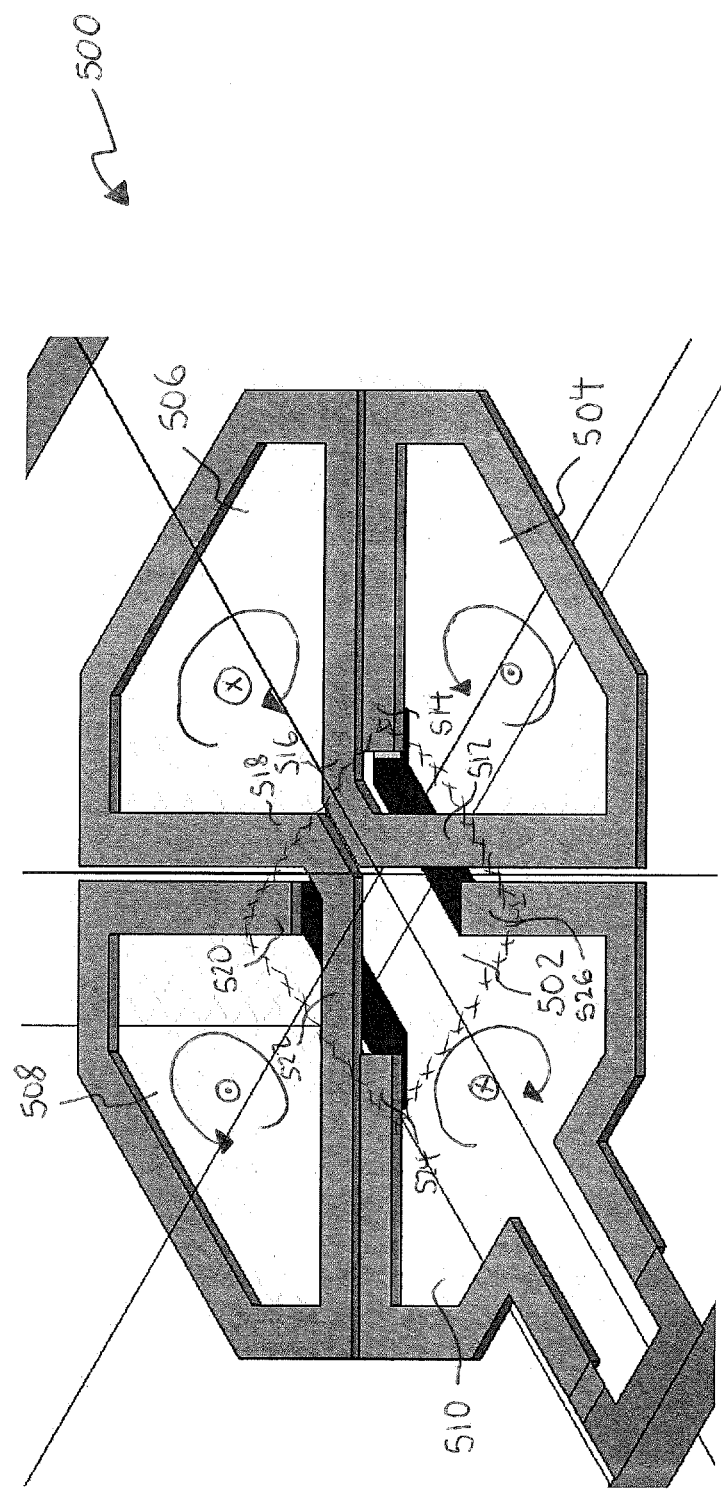
FIG. 5 is a schematic diagram of a 4-loop inductor.

FIG. 4 illustrates just one configuration of a 4-loop inductor structure whose shape results in improved cancellation of the magnetic field components at distance compared to the described prior art configurations. Other configurations of 4-loop inductors also achieve this same effect. For example, FIG. 5 illustrates a further 4-loop inductor structure 500. The inductor structure of FIG. 5 shares many of the same features as that of FIG. 4. The inductor structure of FIG. 5 differs from that of FIG. 4 by the manner in which the ends of all four loops are coupled together in the crossover section 502 of the inductor structure. The crossover section 502 joins each loop end to one other loop end such that when current is applied to the inductor, the current circulates around each loop in an opposite rotational direction to the rotational direction of the current circulation in the loops adjacent to that loop. Loop end 512 of the first loop 504 is directly connected to loop end 516 of the second loop 506. Loop end 518 of the second loop 506 is directly connected to loop end 522 of the third loop 508. Loop end 520 of the third loop 508 is directly connected to loop end 524 of the fourth loop 510. Loop end 526 of the fourth loop 510 is directly connected to loop end 514 of the first loop 504. In the example of FIG. 5, the inductor structure is formed on a planar layer, with the exception of the connection between the fourth loop 510 and the first loop 504 and the connection between the fourth loop 510 and the third loop 520 which underpass the planar layer on a lower metal layer.

The inductor structure of FIG. 5 also differs from that of FIG. 4 in that the inductor structure of FIG. 5 has a more complete octagonal profile than that of FIG. 4. The inductor structure of FIG. 5 does not have the notches described with respect to FIG. 4.

Figure 6:
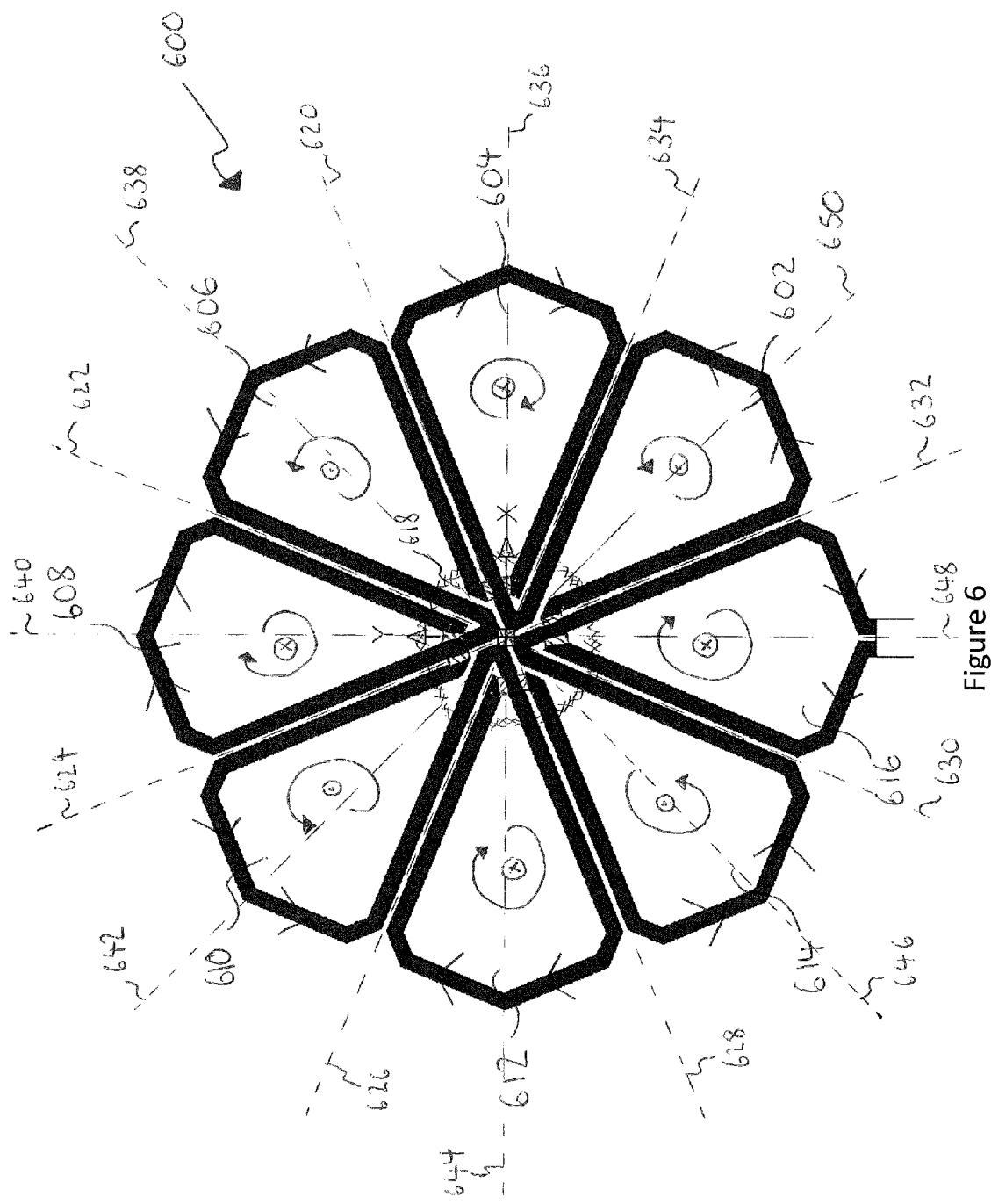
FIG. 6 is a schematic diagram of an 8-loop inductor.

FIG. 6 illustrates a schematic diagram of an exemplary 8-loop inductor structure 600. The inductor structure 600 has a first loop 602, a second loop 604, a third loop 606, a fourth loop 608, a fifth loop 610, a sixth loop 612, a seventh loop 614 and an eighth loop 616. Each loop is open and has a first end and a second end. The ends of all eight loops are coupled together in the central region of the inductor structure referred to herein as the crossover section 618. The crossover section 618 joins each loop end to one other loop end such that when current is applied to the inductor, the current circulates around each loop in an opposite rotational direction to the rotational direction of the current circulation in the loops adjacent to that loop. For example, the first loop is adjacent to the second loop and the eighth loop. The current flows around the first loop in an anti-clockwise direction illustrated by the arrows. However, the current flows around the second loop and the eighth loops in a clockwise direction, as illustrated by the arrows. The same principle applies for each of the eight loops. Preferably, each loop end is joined to only one other loop end in the crossover section.

As was described with respect to FIG. 4, the loops of the inductor structure of FIG. 6 all have the same size and shape. The area encompassed by each loop is identical. Each loop may be mapped directly onto another one of the loops by rotating it about the centre of the inductor structure. A corresponding discussion regarding the segments and the shape of a loop applies with the 8-loop inductor structure as was given for the 4-loop inductor structure, the difference being that the 8-loop inductor structure is composed of eight segments, and each loop has the shape of an eighth of an octagon.

The inductor structure of FIG. 6 exhibits eight degrees of symmetry. The inductor structure is symmetrical about the axes marked 620, 622, 624, 626, 628, 630, 632 and 634. Each of these axes bisects the inductor such that four of the eight loops are wholly on one side of the axis and the other four loops are wholly on the other side of the axis. All of these axes taken together delineate the inductor structure into eight segments, each of which includes one loop of the 8-loop structure. The inductor structure is also symmetrical about the axes marked 636, 638, 640, 642, 644, 646, 648 and 650. The inductor structure has rotational symmetry of order eight, since the structure looks the same when it is rotated by 45°.

As with the 4-loop inductor structure of FIG. 4, the 8-loop inductor structure of FIG. 6 has feed lines which enter the inductor structure via the exterior of the structure via one of the loops. However, the feed lines may alternatively be fed into the middle of the structure as previously described.

Similar to the example of FIG. 4, the crossover section of the inductor structure of FIG. 6 directly connects each loop end with a loop end of an adjacent loop. Thus, one loop end of the first loop 602 is connected to a loop end of the second loop 604; and the other loop end of the first loop 602 is connected to a loop end of the eighth loop 616. The inductor structure is formed on a planar layer, with the exception of alternate connections between loop ends which underpass the planar layer on a lower metal layer.

The crossover section 618 shown on FIG. 6 is encompassed by a hashed box. The crossover section 618 is centred on the centre point of the inductor structure. The crossover section 618 lies wholly within the central region of the inductor structure. Suitably, the central region is defined by a circle centred at the centre of the inductor structure with a radius less than xr. In this definition r is the average length of a straight line connecting the centre point of the inductor structure to an exterior edge of the inductor structure. Preferably x lies in the range ⅓ to ⅑.

The above description with respect to FIGS. 4 to 6 describe the first two inductor structures in a set of inductor structures which have increased cancellation of their radiated magnetic fields at distance compared to the described prior art inductor structures. The 4-loop inductor structure is of order 2. It has $2^N$ loops, where N=2. The 8-loop inductor structure is of order 3. It has $2^N$ loops, where N=3. The increased cancellation of their radiated magnetic fields at distance is exhibited by all members of the set of inductor structures which have $2^N$ loops where N is an integer and N≥2, and for which the loops are coupled together in a central crossover section such that current circulates in opposite rotational directions for adjacent loops.

Magnetic flux is a term used to quantify the intensity of the magnetic field acting over an area. The magnetic flux is dependent on the length of the inductor through which the current is flowing and the area encompassed by the inductor. When the loops of the inductor structure are formed from the same length of inductor and encompass the same area and the same current they generate identical magnetic fluxes. The magnetic field is generated perpendicular to the plane of the inductor structure. When the current around a loop is flowing in a clockwise direction, the magnetic field is generated perpendicularly downwards (i.e. into the paper) as illustrated on FIGS. 4 to 6. When the current around a loop is flowing in an anticlockwise direction, the magnetic field is generated perpendicularly upwards (i.e. out of the paper) as illustrated on FIGS. 4 to 6. Thus, adjacent loops generate identical magnetic field components but in opposite directions. The magnetic field spreads out away from the inductor structure. The resultant magnetic field at distance from the inductor structure is the vector sum of the magnetic field components generated by the loops of the inductor structure. Along the axes which bisect the inductor such that $(2^N)/2$ loops are wholly on one side of the axis and $(2^N)/2$ loops are wholly on the other side of the axis, the magnetic field components from the various loops all cancel out leaving no resultant magnetic field. Thus, the interference/cross coupling effects experienced by circuitry positioned at distance from the inductor structure along these symmetry axes is reduced compared to circuitry positioned outside of prior art inductor structures. As a result of the magnetic field cancellation, other circuitry surrounding the inductor structure can be more densely packed on the chip.

Figure 7:
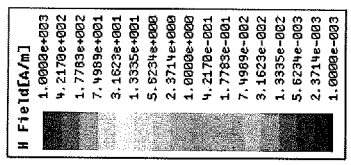
FIG. 7 is a plot illustrating the magnetic field radiated from a 4-loop inductor structure.

FIG. 7 illustrates the magnetic field surrounding a 4-loop inductor structure as described with respect to FIGS. 4 and 5. This plot shows that the magnetic field surrounding the inductor structure is not uniform. The strength of the magnetic field decreases along the axes of symmetry which bisect the inductor such that two loops are wholly on one side, and two loops are wholly on the other side, more quickly than in other directions.

The more loops there are in an inductor structure, the more axes of symmetry there are, the more directions there are in which the magnetic field components cancel at distance from the inductor structure.

Figure 8:
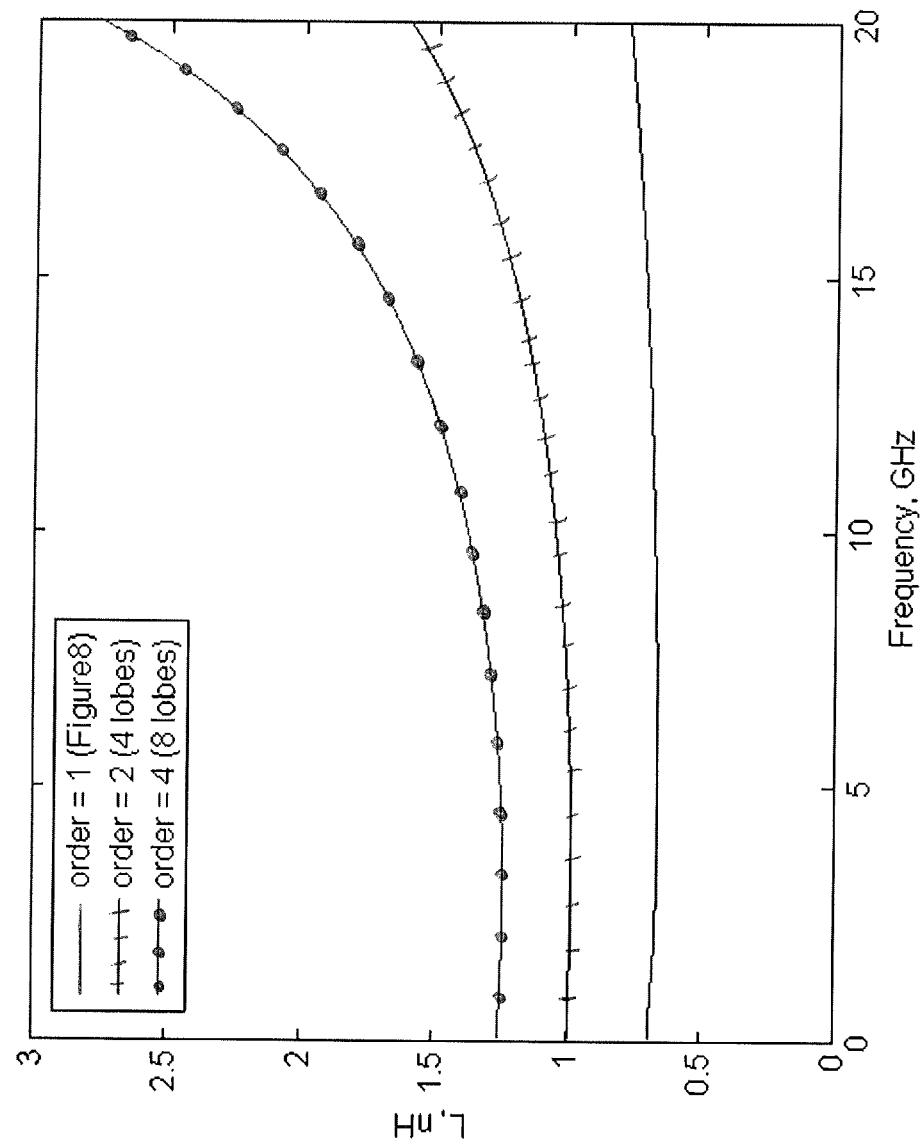
FIG. 8 is a plot illustrating the inductance values achievable using $2^N$ loop inductors.
Figure 7:
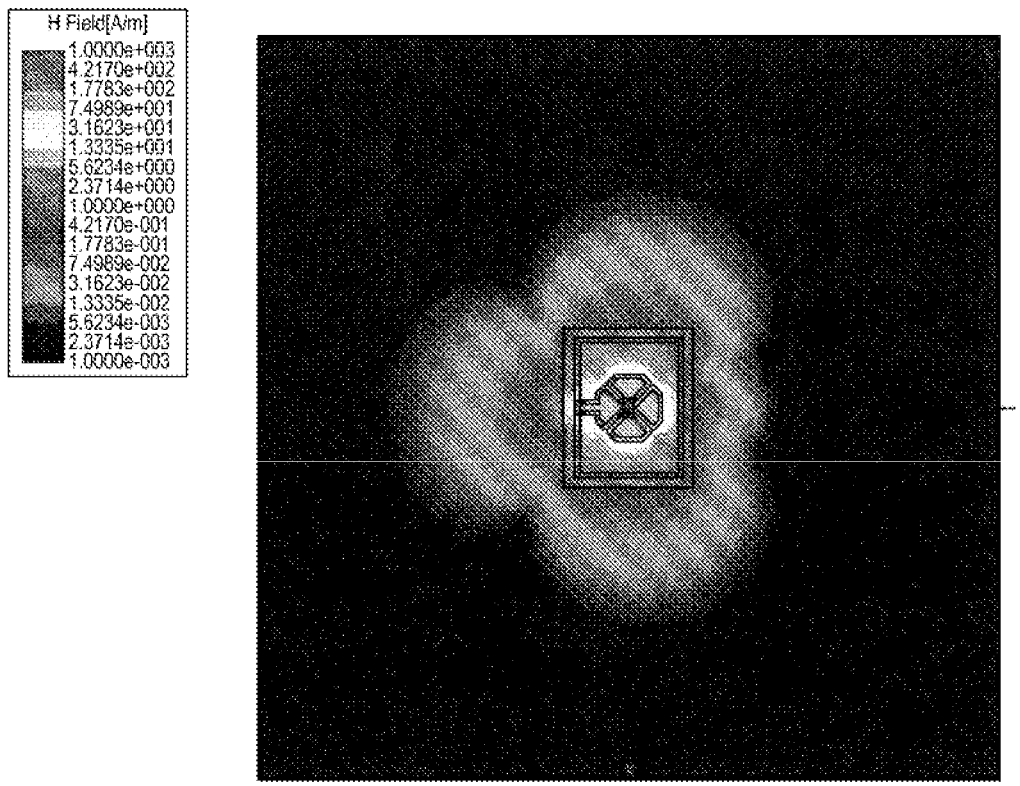

As the number of loops in the inductor structure increases, the inductance achievable using the same footprint increases. The inductance of an inductor is proportional to the length of the inductor. The more loops there are in an inductor, the longer the length of the inductor, the higher the inductance value. FIG. 8 illustrates the inductance values achievable using a prior art figure-of-8 inductor, a 4-loop inductor and an 8-loop inductor. At all frequency values, the 8-loop inductor has higher inductance values than the 4-loop inductor which in turn has higher inductance values than the figure-of-8 inductor. This trend continues for higher order $2^N$ inductor structures.

"At distance" from the inductor means at distances of at least 10r, where r is as previously defined. Preferably "at distance" means at distances of at least 5r. Most preferably "at distance" means at distances of at least r.

In the described inductor structure configurations, each loop of the inductor structure is formed on the same plane. In an alternative arrangement, one or more of the loops of the inductor structure may be formed on a first plane, and one or more loops of the inductor structure may be formed on a second plane, where the second plane is different to the first plane but parallel to the first plane. Such a configuration increases the control over the magnetic flux, and the locations at which the magnetic field components cancel. Thus the cross-coupling effect is decreased at distance form the inductor structure. In this configuration, the crossover section is formed on different metal layers in order to interconnect the loops.

Although the inductor structures shown have an octagonal profile, they may have any suitable profile. For example, they may have a four-sided profile for example a square profile. An octagonal profile uses a smaller area on chip to achieve a similar inductance and Q-value, thus frees up space for other components on chip compared to a four-sided profile.

Two implementations of the arrangement of the loop connections in the crossover section have been shown in FIGS. 4 and 5 for a 4-loop inductor structure, and one arrangement has been shown in FIG. 6 for an 8-loop inductor structure. However, any suitable arrangement of loop connections in the crossover section for any $2^N$ loop inductor structure may be implemented as long as that arrangement is such as to cause the current to flow in opposite rotational directions in adjacent loops. The crossover section for any $2^N$ loop inductor structure may be located as described with respect to the 2-loop inductor structure of FIG. 4. The feed lines for ay $2^N$ loop inductor structure may be located as described with respect to the 2-loop inductor structure of FIG. 4.

The inductor structure forms an unbroken metal line from the first feed line to the second feed line.

In the depicted inductor structures, each of the loops only has one turn. However, the loops may comprise two or more turns of the inductor. Increasing the number of turns of each loop, increases the inductance value of the inductor for the same footprint.

The inductor structures may further comprise a tap. This is particularly easily implemented in the described structures because a tap can be added without crossing the inductor tracks. The tap connects the inductor structure to a supply voltage.

Suitably, the inductor structures are formed by metallisation on a substrate. Suitably, the inductor is formed on an integrated circuit.

The inductor may be defined by, and preferably exclusively by, electrically conductive material: preferably material metallic leads or tracks. Preferably the leads or tracks are defined on or through a substrate of electrically insulating material.

The feed lines may be defined by, and preferably exclusively by, electrically conductive material: preferably metallic leads or tracks. Preferably the leads or tracks are defined on or through a substrate of electrically insulating material.

The inductor structures described may be implemented on two consecutive layers of reduced thickness, for example in a non-UTM metal stack.

The inductor structure of the present invention may be used in an environment in which it is desired to isolate the inductor's magnetic field from another component. In such an environment, the Nth order inductor structure and the other component should preferably be arranged such that the relative orientation of the other component is along any of the axes that bisect the inductor structure such that $(2^N)/2$ loops are wholly on one side of the axis, and $(2^N)/2$ loops are wholly on the other side of the axis. This is because the most effective cancellation of the inductor's magnetic field is achieved along these axes. The other component may be an inductor and it may be desirable to eliminate the electromagnetic coupling between the two inductors.

The inductor of the present invention could be suitably implemented in a voltage controlled oscillator (VCO). In such an implementation, the feed lines connect the inductor to the rest of the VCO. The VCO could suitably be used for providing a steady frequency oscillating signal to a mixer[s] for use in a transmit and/or receive chain of a transceiver. It may be desired to reduce the mutual electromagnetic coupling between the inductor of the VCO and another component in the transceiver. This other component may be another inductor. The other component may be an inductor in another VCO of the transceiver.

The inductor of the present invention could also be suitably implemented in a balun. A balun converts between balanced and unbalanced signals in an environment in which it is desirable to isolate the inductor's magnetic field from the surrounding circuitry in order to avoid interference problems arising from electromagnetic coupling.

The applicant draws attention to the fact that the present invention may include any feature or combination of features disclosed herein either implicitly or explicitly or any generalization thereof, without limitation to the scope of any of the present claims. In view of the foregoing description it will be evident to a person skilled in the art that various modifications may be made within the scope of the invention.

The invention claimed is:

1. An inductor structure comprising:
   an even number of segments, each segment adjacent to two other segments, each segment including a loop, each loop having a first end and a second end;
   wherein each of the first ends and second ends of the loops are coupled together so as to cause current to circulate around the loop of each segment in an opposite rotational direction to the direction of current circulation in the loops of the segments adjacent to that segment, and
   at least one feed line connector arranged to connect the inductor structure to a feed line, the at least one feed line connector being located at a region where the first and second ends of the loops are coupled together.

2. An inductor structure as claimed in claim 1, wherein the areas circumscribed by each loop are the same.

3. An inductor structure as claimed in claim 1, wherein each loop has the same size and shape to the other loops in the inductor structure.

4. An inductor structure as claimed in claim 1, the segments being radially located about an azimuthal axis.

5. An inductor structure as claimed in claim 1, wherein the region where the first and second ends of the loops are coupled together is a crossover section located at the centre of the inductor structure, and the structure has rotational symmetry about an azimuthal axis located at the center of the inductor structure, each loop being located in a plane perpendicular to the azimuthal axis.

6. An inductor structure as claimed in claim 1, wherein the inductor structure is symmetrical about at least four axes.

7. An inductor structure as claimed in claim 1, wherein a first feed line and a second feed line are both connected to a loop of a segment at the periphery of the inductor structure.

8. An inductor structure as claimed in claim 7, wherein the inductor structure forms an unbroken metal line from the first feed line to the second feed line.

9. An inductor structure as claimed in claim 1, wherein the region where the first and second ends of the loops are coupled together is a crossover section that couples the first ends and second ends of the loops such that, for each segment, the first end of the loop of the segment is connected to the first end of the loop of one of the adjacent segments.

10. An inductor structure as claimed in claim 9, wherein the crossover section couples the first ends and second ends of the loops such that, for each segment, the second end of the loop of the segment is connected to the second end of the loop of the other one of the adjacent segments.

11. An inductor structure as claimed in claim 1, wherein each loop comprises a first turn and a second turn.

12. An inductor structure as claimed in claim 11, wherein the second turn circumscribes the first turn.

13. An inductor structure as claimed in claim 1, including four segments only.

14. An inductor structure as claimed in claim 1, including eight segments only.

15. An inductor structure as claimed in claim 1, having an octagonal profile.

16. An inductor structure as claimed in claim 1, wherein all the segments are located on the same plane.

17. An inductor structure as claimed in claim 1, wherein one of the segments is located on a first plane, and another of the segments is located on a second plane, the second plane being different to the first plane and parallel to the first plane.

18. An inductor structure as claimed in claim 1, wherein the inductor structure is formed by metallisation on a substrate.

19. An inductor structure as claimed in claim 18, wherein the region where the first and second ends of the loops are coupled together is a crossover section that is formed on different metal layers.

20. An integrated circuit including an inductor structure as claimed in claim 1.

* * * * *

UNITED STATES PATENT AND TRADEMARK OFFICE
CERTIFICATE OF CORRECTION

| | | |
|---|---|---|
| PATENT NO. | : 8,576,039 B2 | Page 1 of 1 |
| APPLICATION NO. | : 13/312683 | |
| DATED | : November 5, 2013 | |
| INVENTOR(S) | : Yoon et al. | |

It is certified that error appears in the above-identified patent and that said Letters Patent is hereby corrected as shown below:

In the Specification

<u>Column 8, line 63</u>

"for ay 2N loop" should read -- for any 2N loop --

Signed and Sealed this
Twenty-fifth Day of August, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,576,039 B2 | |
| APPLICATION NO. | : 13/312683 | |
| DATED | : November 5, 2013 | |
| INVENTOR(S) | : Yoon et al. | |

It is certified that error appears in the above-identified patent and that said Letters Patent is hereby corrected as shown below:

In the drawings

Figure 7 should be as follows:

Signed and Sealed this
Fifteenth Day of December, 2015

Michelle K. Lee
*Director of the United States Patent and Trademark Office*